(12) United States Patent
Lee et al.

(10) Patent No.: US 10,883,889 B2
(45) Date of Patent: Jan. 5, 2021

(54) DISPLAY DEVICE INCLUDING A PRESSURE SENSOR WITH AN OPENING IN THE ELECTRODE

(71) Applicant: Samsung Display Co., Ltd., Yongin-Si (KR)

(72) Inventors: Hee-kwon Lee, Asan-si (KR); Sungun Park, Suwon-si (KR); Youngjoo Lee, Busan (KR); Jeongil Yoo, Seoul (KR)

(73) Assignee: Samsung Display Co., Ltd.

( * ) Notice: Subject to any disclaimer, the term of this patent is extended or adjusted under 35 U.S.C. 154(b) by 18 days.

(21) Appl. No.: 16/262,903

(22) Filed: Jan. 30, 2019

(65) Prior Publication Data
US 2019/0265113 A1 Aug. 29, 2019

(30) Foreign Application Priority Data
Feb. 23, 2018 (KR) .................. 10-2018-0021965

(51) Int. Cl.
| | |
|---|---|
| *G01L 1/14* | (2006.01) |
| *H01L 51/00* | (2006.01) |
| *H01L 51/52* | (2006.01) |
| *H05K 1/18* | (2006.01) |
| *H05K 1/11* | (2006.01) |
| *H05K 1/16* | (2006.01) |
| *G06F 3/041* | (2006.01) |
| *G06F 3/044* | (2006.01) |
| *H03K 17/96* | (2006.01) |

(52) U.S. Cl.
CPC .............. *G01L 1/146* (2013.01); *G06F 3/041* (2013.01); *G06F 3/044* (2013.01); *G06F 3/0416* (2013.01); *H01L 51/0097* (2013.01); *H01L 51/5203* (2013.01); *H03K 17/962* (2013.01); *H05K 1/111* (2013.01); *H05K 1/16* (2013.01); *H05K 1/18* (2013.01); *G06F 2203/04105* (2013.01); *G06F 2203/04112* (2013.01); *H05K 2201/09381* (2013.01); *H05K 2201/10128* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 2016/0299598 A1 | 10/2016 | Yoon et al. | |
| 2017/0220838 A1* | 8/2017 | He | G06F 3/0412 |
| 2018/0166507 A1* | 6/2018 | Hwang | G06F 3/0416 |

FOREIGN PATENT DOCUMENTS

| | | |
|---|---|---|
| KR | 10-2016-0037409 A | 4/2016 |
| KR | 10-1652029 B1 | 8/2016 |
| KR | 10-2017-0061592 A | 6/2017 |
| KR | 10-2017-0097963 A | 8/2017 |

\* cited by examiner

*Primary Examiner* — Stephen T. Reed
(74) *Attorney, Agent, or Firm* — Innovation Counsel LLP (57) ABSTRACT

A display device includes a display panel and a pressure sensor. The display panel displays a pressure sensing image which induces a user to apply a pressure in a specific situation. The pressure sensor is disposed under the display panel, and a portion of the pressure sensor overlaps with the pressure sensing image. An opening portion is defined in a part of an electrode of the pressure sensor that does not overlap with the pressure sensing image.

20 Claims, 11 Drawing Sheets

DISPLAY DEVICE INCLUDING A PRESSURE SENSOR WITH AN OPENING IN THE ELECTRODE

CROSS-REFERENCE TO RELATED APPLICATION

This U.S. non-provisional patent application claims priority, under 35 U.S.C. § 119, to Korean Patent Application No. 10-2018-0021965 that was filed on Feb. 23, 2018, the entire contents of which are hereby incorporated by reference.

BACKGROUND

The present disclosure relates to a display device including a pressure sensor, and more particularly, to a display device including a pressure sensor with improved sensitivity.

Display devices, portable terminals and other information processing devices may perform their functions using various input devices. Recently, input devices including touch sensing units have been widely used.

A touch sensing function may be performed through a touch sensor that senses and recognizes a touch of a human body (e.g., a finger) or a pen by sensing a current of the human body or a change in pressure or temperature. In particular, a pressure sensor which senses the touch of the human body or the pen based on change in pressure is getting much attention.

The pressure sensor may have a structure in which a compressible and restorable material such as an air gap or silicon is provided between two electrodes. The pressure sensor may detect a pressure by sensing a change in capacitance, which is caused by a change in distance between the two electrodes by a touch input.

SUMMARY

The present disclosure may provide a display device capable of accurately measuring a pressure applied to a specific position.

In an embodiment of the inventive concept, a display device may include a display panel and a pressure sensor. A display area for display an image may be defined in the display panel, and a pressure sensing image may be displayed in the display area. The pressure sensor may be disposed under the display panel and may be configured to sense a pressure applied to the pressure sensing image.

In an embodiment, the pressure sensor may include a first electrode including a first overlapping electrode overlapping with the pressure sensing image and a first non-overlapping electrode not overlapping with the pressure sensing image, a second electrode overlapping with the first electrode, and an insulating member disposed between the first electrode and the second electrode and having elasticity. At least one opening portion may be defined in the first non-overlapping electrode;

In an embodiment, the pressure sensing image may be displayed adjacent to an edge of the display area.

In an embodiment, the first non-overlapping electrode may be closer to a center of the display area than the first overlapping electrode, when viewed in a plan view.

In an embodiment, the first non-overlapping electrode may extend from the first overlapping electrode.

In an embodiment, a portion of a boundary of the first non-overlapping electrode may have a shape corresponding to a shape of a portion of a boundary of the pressure sensing image.

In an embodiment, the first non-overlapping electrode may have a mesh shape.

In an embodiment, the display device may further include an adhesive member disposed between the pressure sensor and the display panel.

In an embodiment, the display device may further include a driving unit including a pressure sensing circuit configured to sense a change in capacitance of the pressure sensor, and a printed circuit board on which the pressure sensing circuit is mounted.

In an embodiment, the printed circuit board may be disposed under the pressure sensor.

In an embodiment, the second electrode may be disposed under the first electrode.

In an embodiment, the first electrode may be disposed under the second electrode.

In an embodiment, the second electrode may include a second overlapping electrode overlapping with the pressure sensing image, and a second non-overlapping electrode not overlapping with the pressure sensing image. At least one opening portion may be defined in the second non-overlapping electrode.

In an embodiment, the insulating member may include an overlapping insulating member overlapping with the pressure sensing image, and a non-overlapping insulating member not overlapping with the pressure sensing image. At least one opening portion may be defined in the non-overlapping insulating member.

In an embodiment, the pressure sensor may further include a first adhesive member disposed between the first electrode and the insulating member, and a second adhesive member disposed between the second electrode and the insulating member.

In an embodiment, the insulating member may have adhesive strength so as to be adhered to the first electrode or the second electrode.

In an embodiment of the inventive concept, a display device may include a display panel, a sensing electrode, an insulating member, and a printed circuit board. A display area to display an image may be defined in the display panel, and the display area may include a pressure applying area configured to receive a pressure applied from an outside. The sensing electrode may be disposed under the display panel and may include an overlapping electrode overlapping with the pressure applying area, and a non-overlapping electrode not overlapping with the pressure applying area. At least one opening portion may be defined in the non-overlapping electrode. The insulating member may be disposed under the sensing electrode and may have elasticity. The printed circuit board may include a plurality of pads, and one of the pads may be disposed under the insulating member.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

The inventive concept now will be described more fully hereinafter with reference to the accompanying drawings, in which various embodiments are shown. The inventive concept may, however, be embodied in many different forms, and should not be construed as limited to the embodiments set forth herein. Rather, these embodiments are provided so that this disclosure will be thorough and complete, and will fully convey the scopes of the inventive concept to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Figure 1:
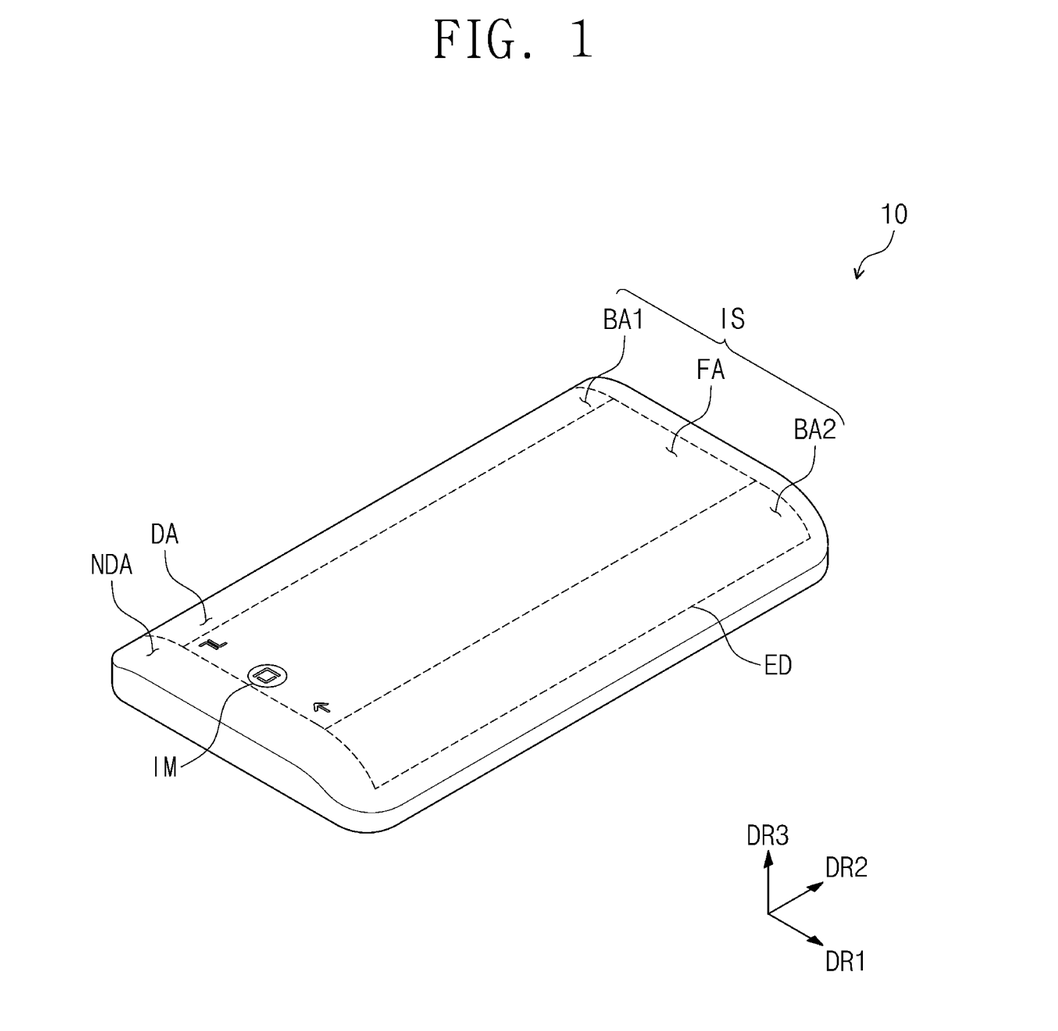
FIG. 1 is a perspective view illustrating a display device according to an embodiment of the inventive concept.
Figure 2:
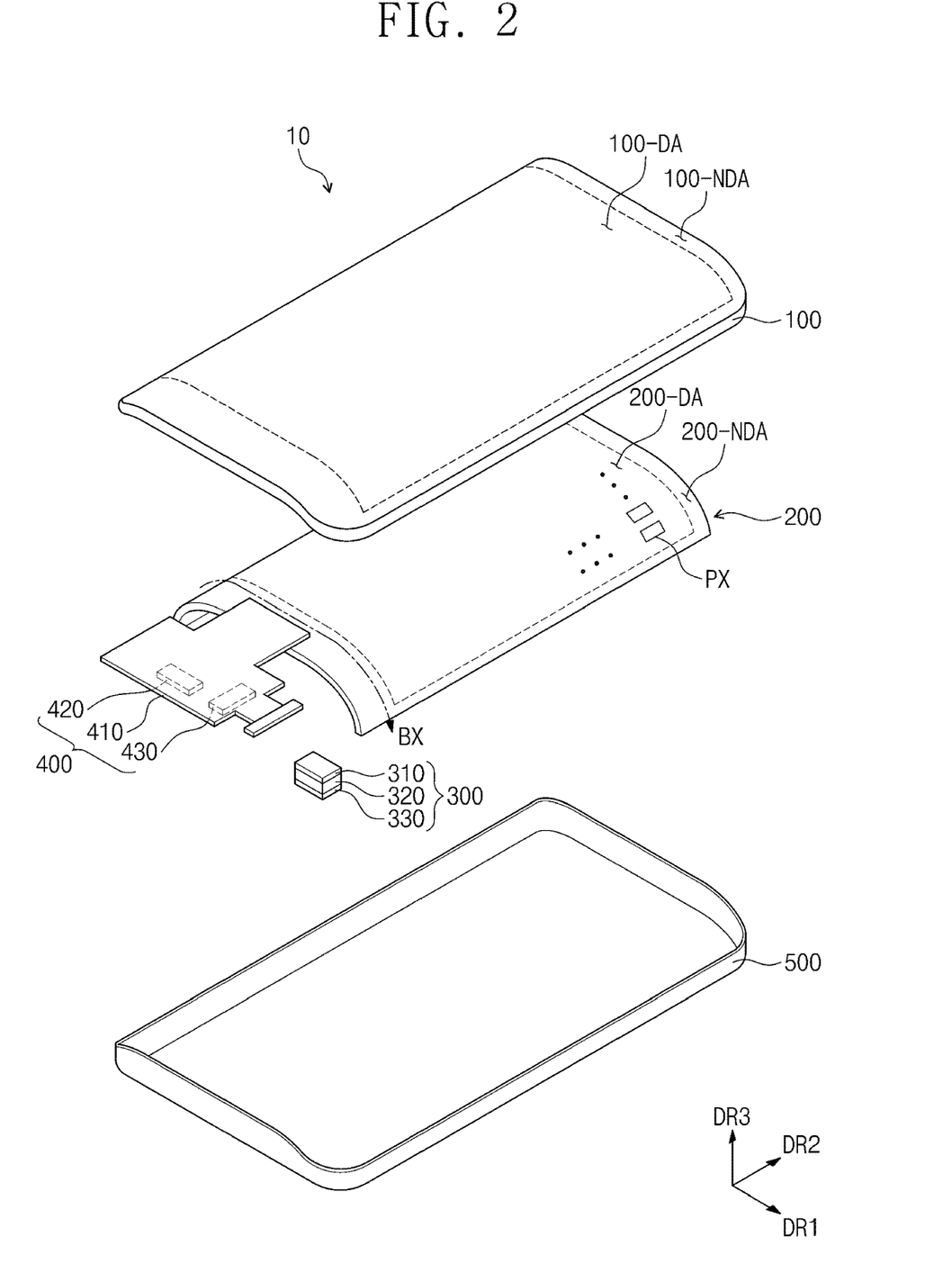
FIG. 2 is an exploded perspective view illustrating the display device of FIG. 1.

FIG. 1 is a perspective view illustrating a display device 10 according to an embodiment of the inventive concept. FIG. 2 is an exploded perspective view illustrating the display device 10 of FIG. 1.

In FIG. 1, a portable terminal is illustrated as an example of the display device 10 according to an embodiment. The portable terminal may include a tablet personal computer (tablet PC), a smart phone, a personal digital assistant (PDA), a portable multimedia player (PMP), a game console, or a watch-type electronic device. However, embodiments of the inventive concept are not limited thereto. The display device 10 according to embodiments of the inventive concept may be applied to large-sized electronic devices (e.g., televisions or external billboards) and small and mid-sized electronic devices (e.g., personal computers, notebook computers, car navigation units, or cameras). However, these are provided only as embodiments of the inventive concept. In still other embodiments, the display device 10 may be applied to other various electronic devices as long as they do not depart from the spirits and scopes of the inventive concept.

A display area DA and a non-display area NDA may be defined in the display device 10. An image may be displayed in the display area DA, and the non-display area NDA may be adjacent to the display area DA. For example, the display area DA may have a quadrilateral shape (e.g., a rectangular shape) in a plan view. The non-display area NDA may surround the display area DA in a plan view.

A side portion of the display device 10 may have a bent shape. An outer surface IS of the display device 10 may include a flat surface FA and curved surfaces BA1 and BA2. The outer surface IS may correspond to an outermost surface of the display device 10.

The flat surface FA may be parallel to a plane defined by a first direction DR1 and a second direction DR2. Each of the curved surfaces BA1 and BA2 may have a shape which extends from the flat surface FA and curves from the flat surface FA.

A third direction DR3 may be a reference direction used to define a front surface and a rear surface of each of the members and may be orthogonal to the flat surface FA. However, the directions may be relative concepts and may be changed into other directions.

FIG. 1 illustrates an embodiment in which a pressure sensing image IM is displayed in the display area DA. The pressure sensing image IM may be displayed at a position adjacent to an edge ED of the display area DA (e.g., a boundary between the display area DA and the non-display area NDA).

The pressure sensing image IM may be displayed in a specific situation for controlling the display device 10. The pressure sensing image IM may be an image for inducing a user to apply a pressure to an area PA (see FIG. 4) of the display area DA, in which the pressure sensing image IM is displayed. Hereinafter, the area PA of the display area DA is referred to as 'a pressure applying area'.

For example, the pressure sensing image IM may be a "home" button in an operating system for controlling the display device 10. The home button may be a term widely used in the operating system of the display device 10 such as a smart phone, and thus detailed descriptions thereto are omitted.

Referring to FIGS. 1 and 2, the display device 10 may include a window member 100, a display panel 200, a pressure sensor 300, a driving unit 400, and a back case 500. In an embodiment, the display device 10 may further include a waterproof member (not shown) and a bracket (not shown).

The window member 100 may be disposed on the display panel 200 in the third direction DR3.

The window member 100 may include a display area 100-DA corresponding to the display area DA of the display device 10 and a non-display area 100-NDA corresponding to the non-display area NDA of the display device 10.

In an embodiment of the inventive concept, the window member 100 may provide the flat surface FA and the curved surfaces BA1 and BA2 of the display device 10.

The window member 100 may include plastic or glass. The window member 100 may be flexible or rigid. The window member 100 may be transparent to transmit incident light.

In an embodiment of the inventive concept, an area (or a size) of the window member 100 may be greater than an area (or a size) of the display panel 200. Thus, the window member 100 may completely cover one surface of the display panel 200.

The window member 100 may be coupled to the back case 500 and may provide the outer surface IS as described above. The outer surface IS of the window member 100 may be a touch surface of the display device 10 to which an external object may be touched.

A display area 200-DA and a non-display area 200-NDA adjacent to the display area 200-DA may be defined in the display panel 200. A plurality of pixels PX may be disposed in the display area 200-DA of the display panel 200.

The display panel 200 may include a plurality of signal lines and the plurality of pixels PX connected to the signal lines and may display an image. Each of the pixels PX may include an organic light emitting element and a pixel circuit for driving the organic light emitting element. The pixels PX may emit light in response to electrical signals transmitted from the driving unit 400.

However, the display panel 200 according to the inventive concept is not limited to a specific type. For example, the display panel 200 may be an organic light emitting display panel, a liquid crystal display panel, or a plasma display panel. In the present embodiment, the organic light emitting display panel will be described as an example of the display panel 200.

The driving unit 400 may include a printed circuit board 410, a driving circuit 420, and a pressure sensing circuit 430. In an embodiment of the inventive concept, the driving circuit 420 and/or the pressure sensing circuit 430 may be mounted on the printed circuit board 410.

The driving unit 400 may provide signals to the display panel 200 and/or may receive signals from the display panel 200. A connector used to receive signals from the outside may be connected to the driving unit 400.

The printed circuit board 410 may be connected to one surface of the display panel 200. The printed circuit board 410 may be curved to be disposed under the display panel 200. Alternatively, a portion of the display panel 200 on which the printed circuit board 410 is adhered, may be curved along a contour line BX such that the printed circuit board 410 may be disposed under the display panel 200.

Hereinafter, the embodiment in which the portion of the display panel 200 is curved along the contour line BX will be described as an example.

The printed circuit board 410 may be electrically connected to the display panel 200 and the pressure sensor 300 disposed under the display panel 200.

The driving circuit 420 may generate various driving signals and may provide the generated driving signals to the display panel 200 through the printed circuit board 410.

The pressure sensing circuit 430 may be electrically connected to the pressure sensor 300 through the printed circuit board 410. The pressure sensing circuit 430 may sense the amount of change in capacitance of the pressure sensor 300 caused by an external pressure and may output an electrical signal corresponding to the sensed amount of change in the capacitance.

The pressure sensor 300 may include a first electrode 310, an insulating member 320, and a second electrode 330.

The pressure sensor 300 may be disposed under the display panel 200 in the third direction DR3. At least a portion of the pressure sensor 300 may be disposed to overlap with the pressure applying area PA.

At least a portion of the first electrode 310 may overlap with the pressure applying area PA, and the first electrode 310 may be disposed under the display panel 200 in the third direction DR3. The first electrode 310 may be disposed to overlap with the display area DA.

The second electrode 330 may overlap with the first electrode 310 and may be disposed under the first electrode 310. The second electrode 330 may be disposed on the printed circuit board 410.

The first and second electrodes 310 and 330 may include a metal material or a conductive polymer.

The insulating member 320 may be disposed between the first electrode 310 and the second electrode 330. The insulating member 320 may include an elastic material which is compressed by an external pressure and is restored to its original state when the external pressure is interrupted.

In some embodiments, the pressure sensor 300 may be one of various types of pressure sensors. For example, the pressure sensor 300 may be a capacitive pressure sensor, a piezoresistive silicon pressure sensor, or a capacitive silicon pressure sensor. In the present embodiment, the capacitive pressure sensor is described as an example of the pressure sensor 300.

The back case 500 may be coupled to the window member 100 to receive the display panel 200. The back case 500 may include plastic or metal. The back case 500 may protect the display panel 200 from an external impact. In an embodiment of the inventive concept, the back case 500 may be omitted.

Figure 3:
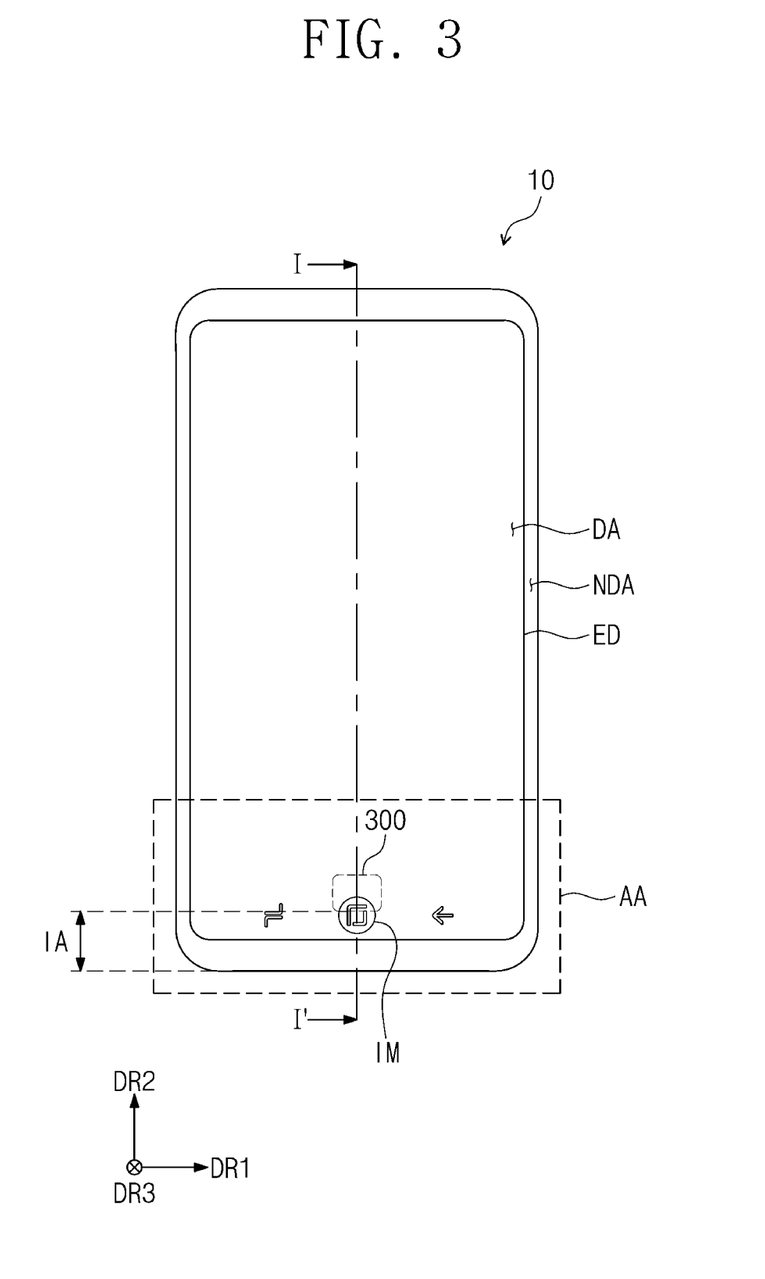
FIG. 3 is a plan view illustrating the display device of FIG. 1.
Figure 4:
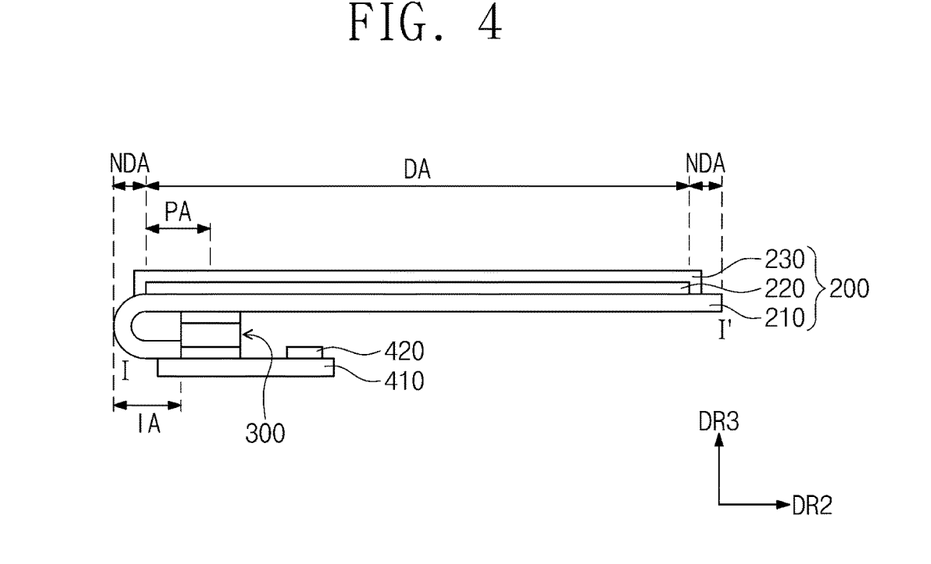
FIG. 4 is a cross-sectional view taken along a line I-I' of FIG. 3.

FIG. 3 is a plan view illustrating the display device 10 of FIG. 1. FIG. 4 is a cross-sectional view taken along a line I-I' of FIG. 3.

The pressure applying area PA in which the pressure sensing image IM is displayed may be defined in the display area DA. A portion of the pressure applying area PA may overlap with a portion of a non-placement area IA.

The display panel 200 may include a base member 210, a light emitting element layer 220, and an encapsulation member 230.

The base member 210 may be flexible. For example, the base member 210 may include polyimide (PI).

The light emitting element layer 220 may be disposed on the base member 210. The light emitting element layer 220 may include the pixels PX (see FIG. 2).

The encapsulation member 230 may cover the light emitting element layer 220. In some embodiments, the encapsulation member 230 may encapsulate the light emitting element layer 220.

The non-placement area IA may be defined in the display device 10. As illustrated in FIG. 4, the non-placement area IA may be defined by a portion of the base member 210, which is bent along the contour line BX. Due to the bent portion of the base member 210, electronic components such as the pressure sensor 300 may not be disposed in the non-placement area IA.

Thus, the pressure sensor 300 may not be disposed in the non-placement area IA but may be placed as close to the non-placement area IA as possible, or adjacent to the non-placement area IA.

The pressure applying area PA in which the pressure sensing image IM is displayed may be defined to overlap with a portion of the non-placement area IA and a portion of the pressure sensor 300. The pressure sensing image IM may be the home button and may be disposed adjacent to the edge ED of the display area DA on UI/UX design. However, due to the non-placement area IA, the pressure sensor 300 may not be precisely aligned with the pressure applying area PA.

Figure 5:
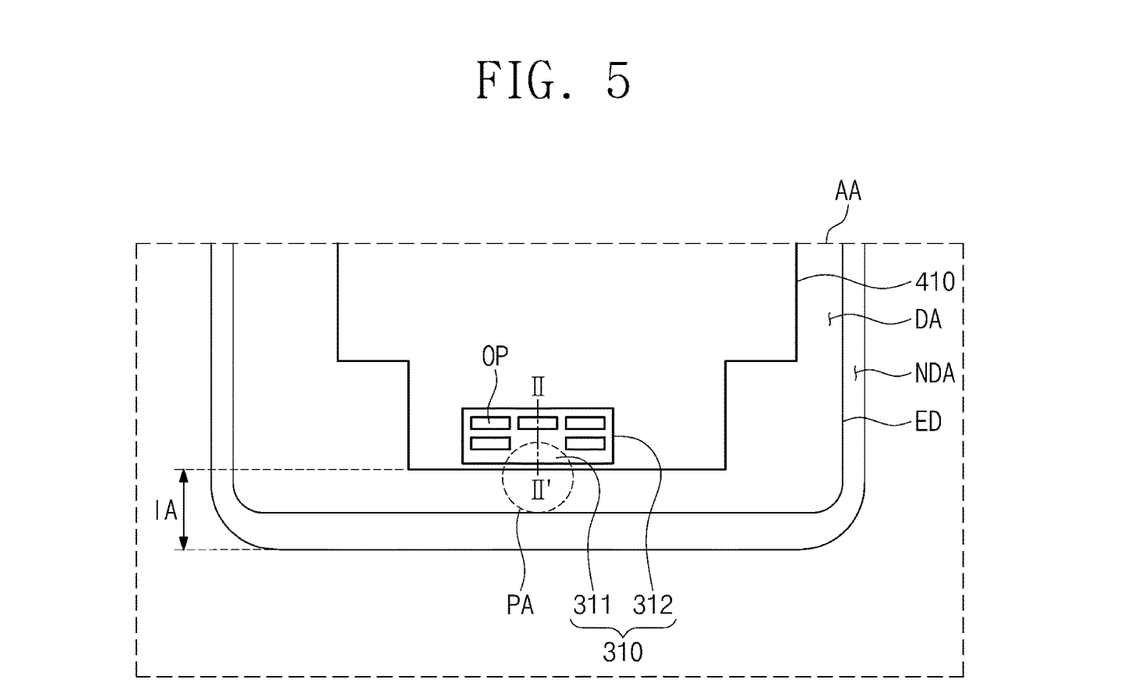
FIG. 5 is an enlarged plan view illustrating some of components disposed in an area 'AA' of FIG. 3.

FIG. 5 is an enlarged plan view illustrating some of components disposed in an area 'AA' of FIG. 3.

The first electrode 310 of the pressure sensor 300 and the printed circuit board 410 are illustrated in the area 'AA' of the display device 10.

The first electrode 310 may include a first overlapping electrode 311 overlapping with the pressure applying area PA and a first non-overlapping electrode 312 not overlapping with the pressure applying area PA. The first non-overlapping electrode 312 may extend from the first overlapping electrode 311, and the first non-overlapping electrode 312 and the first overlapping electrode 311 may constitute a single unitary body.

The first non-overlapping electrode 312 may be closer to a center of the display area DA than the first overlapping electrode 311.

At least one opening portion OP is defined in the first non-overlapping electrode 312 of the first electrode 310. An area of the first non-overlapping electrode 312 may be reduced by the opening portion OP. Since the area of the first non-overlapping electrode 312 is reduced, an initial capacitance value when a pressure is not applied to the pressure sensor 300 may be reduced.

Figure 6:
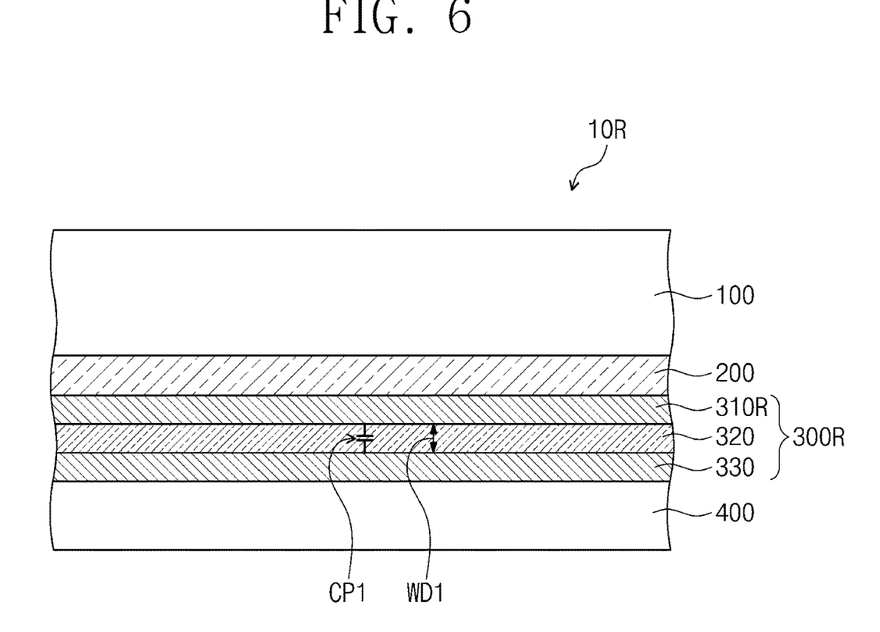
FIG. 6 is a cross-sectional view illustrating a display device including a capacitive pressure sensor according to a comparative example.
Figure 7:
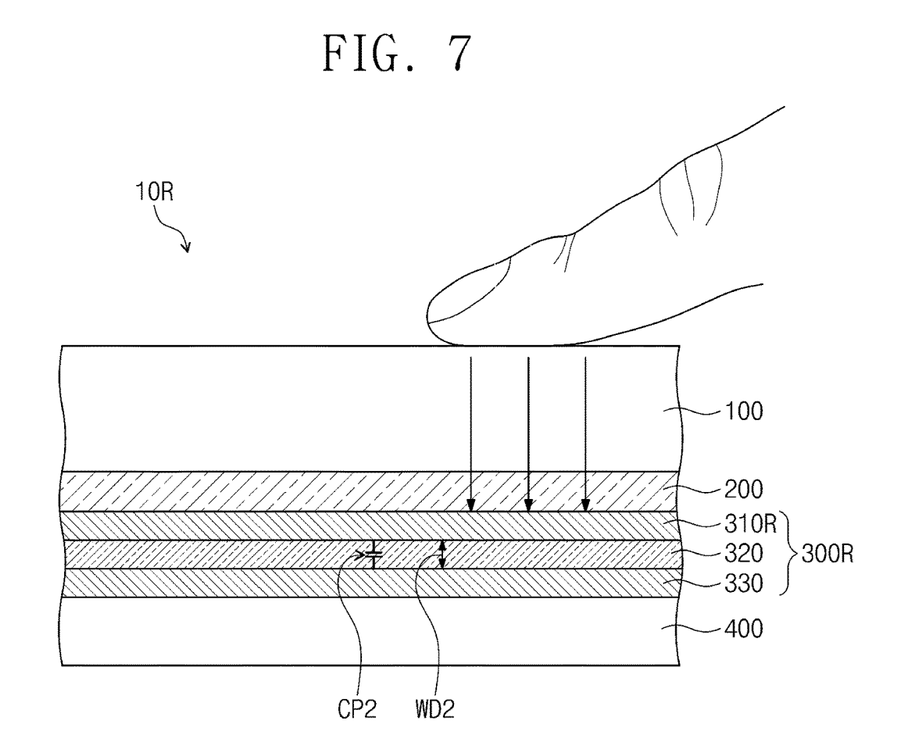
FIG. 7 illustrates a case in which a pressure is applied to the display device of FIG. 6.

FIG. 6 is a cross-sectional view illustrating a display device 10R including a capacitive pressure sensor according to a comparative example. FIG. 7 illustrates a case in which pressure is applied to the display device 10R of FIG. 6. To describe embodiments of the inventive concept, FIGS. 6 and 7 illustrate a display device including a pressure sensor which does not include an opening portion, according to a comparative example.

Referring to FIG. 6, when an external pressure is not applied, an insulating member 320 between first and second electrodes 310R and 330 of a pressure sensor 300R is not deformed since a pressure applied to the display device 10R in a vertical direction does not exist. A thickness of the insulating member 320 which is not deformed may be defined as a first thickness WD1. At this time, a capacitor formed by the first and second electrodes 310R and 330 and the insulating member 320 may have a first capacitance CP1. Here, the insulating member 320 may be used as a dielectric of the capacitor.

Referring to FIG. 7, when an external object (e.g., a finger) applies a pressure to a top surface of the display device 10R, the applied pressure may be transferred to the pressure sensor 300R to deform the insulating member 320. A thickness of the insulating member 320 deformed by the applied pressure may be defined as a second thickness WD2.

The second thickness WD2 is less than the first thickness WD1. With the insulating member 320 having the second thickness WD2, the capacitor formed by the first and second electrodes 310R and 330 and the insulating member 320 may have a second capacitance CP2 greater than the first capacitance CP1.

A pressure sensing circuit connected to the pressure sensor 300R may sense the strength of the pressure by using a difference between the first capacitance CP1 and the second capacitance CP2. In other words, as the difference between the first and second capacitances CP1 and CP2 increases, the pressure sensing circuit may determine that the applied pressure increases. As the applied pressure increases, the accuracy of a signal outputted to the display device 10R may increase.

Here, if the second thickness WD2 is not sufficiently reduced by distribution of the pressure sensor 300R, a structure of the display device 10R and/or an applied position of the pressure, the second capacitance CP2 may not be sufficiently increased.

In this case, when the first capacitance CP1 has a very large value, the difference between the first and second capacitances CP1 and CP2 may be small. When the difference between the first and second capacitances CP1 and CP2 is small, the display device 10R may not accurately sense the external pressure, and thus it may be difficult to maintain constant sensitivity.

However, according to the embodiments of the inventive concept, an initial capacitance may be reduced to maintain a constant sensitivity by increasing a capacitance difference. This will be described hereinafter in detail.

Figure 8:
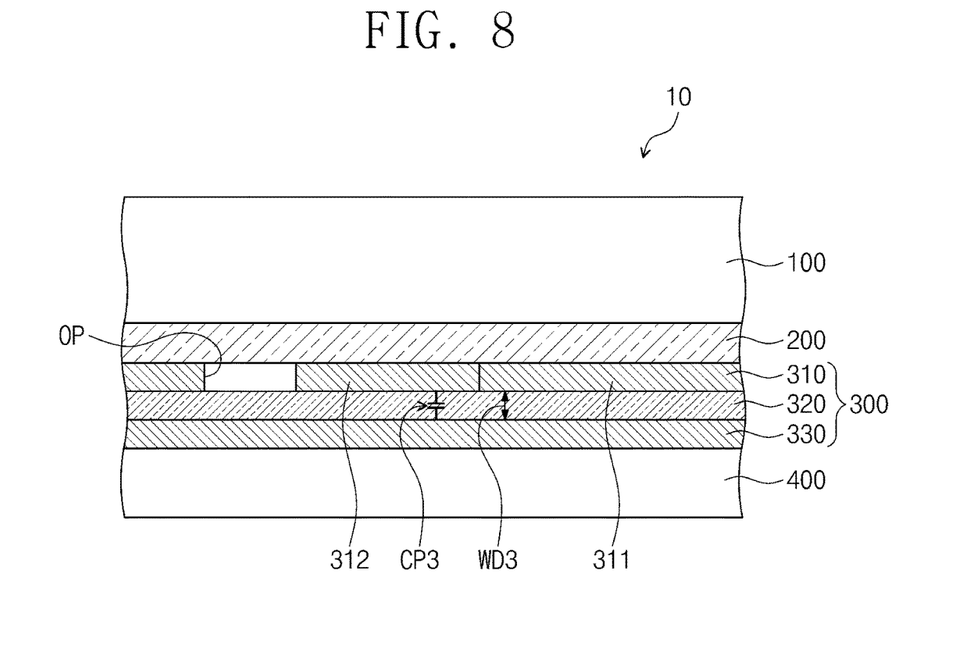
FIG. 8 is a cross-sectional view taken along a line II-II' of FIG. 5.
Figure 9:
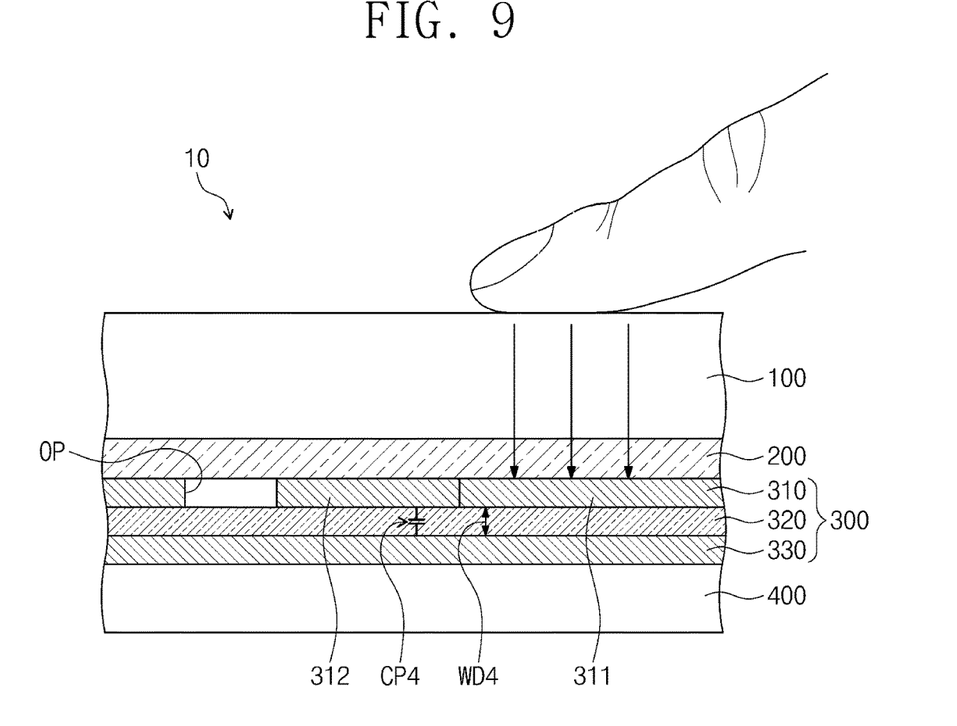
FIG. 9 illustrates a case in which a pressure is applied to the display device of FIG. 8.

FIG. 8 is a cross-sectional view taken along a line II-II' of FIG. 5 to illustrate the display device 10. FIG. 9 illustrates a case in which a pressure is applied to the display device 10 of FIG. 8.

FIGS. 8 and 9 illustrate the display device 10 which includes the pressure sensor 300 including the opening portion OP according to an embodiment of the inventive concept.

As illustrated in FIG. 4, the pressure applying area PA may not be precisely aligned with the pressure sensor 300. Thus, an external pressure may not be uniformly applied to the whole of the first electrode 310 but may be mainly applied to the first overlapping electrode 311 of the first electrode 310.

Referring to FIG. 8, when an external pressure is not applied, the insulating member 320 between the first and second electrodes 310 and 330 of the pressure sensor 300 is not deformed since a pressure applied to the display device 10 in a vertical direction does not exist. A thickness of the insulating member 320 which is not deformed may be defined as a third thickness WD3. At this time, a capacitor formed by the first and second electrodes 310 and 330 and the insulating member 320 may have a third capacitance CP3.

The third thickness WD3 may be equal to the first thickness WD1 of FIG. 6. However, according to an embodiment of the inventive concept, since at least one opening portion OP is defined in the first non-overlapping electrode 312, the area of the first electrode 310 is reduced. Thus, the third capacitance CP3 is less than the first capacitance CP1 of FIG. 6.

Referring to FIG. 9, when an external object (e.g., a finger) applies a pressure to a top surface of the display device 10, the applied pressure may be transferred to the pressure sensor 300 to deform the insulating member 320. A thickness of the insulating member 320 deformed by the applied pressure may be defined as a fourth thickness WD4. The fourth thickness WD4 is less than the third thickness WD3. Hence, the capacitor formed by the first and second electrodes 310 and 330 and the insulating member 320 may have a fourth capacitance CP4 greater than the third capacitance CP3.

At this time, the pressure applied to the first overlapping electrode 311 is greater than the pressure applied to the first non-overlapping electrode 312, and a vertical distance in an area corresponding to the first overlapping electrode 311 is further changed. Thus, a capacitance of the area corresponding to the first overlapping electrode 311 is greatly changed. Accordingly, the fourth capacitance CP4 is greater than the second capacitance CP2 of FIG. 6.

As a result, a difference between the third and fourth capacitances CP3 and CP4 is greater than the difference between the first and second capacitances CP1 and CP2, and thus the pressure sensing circuit 430 may provide a more accurate signal to the display device 10. Accordingly, the display device 10 may maintain a pressure sensing sensitivity which may be substantially accurate and constant.

FIGS. 10, 11, 12 and 13 are enlarged plan views illustrating modified embodiments of some of components disposed in the area 'AA' of FIG. 5.

Figure 10:
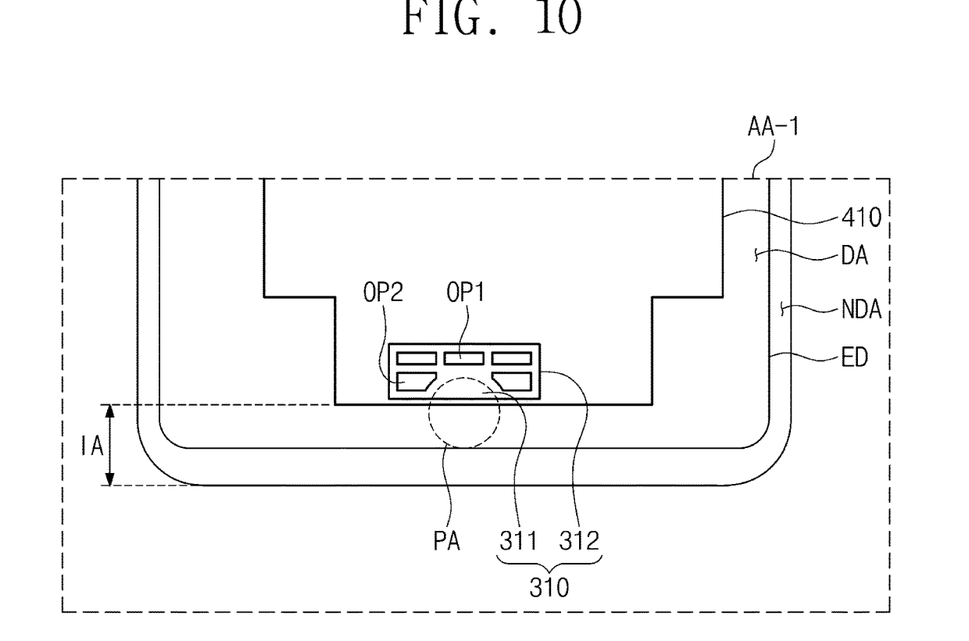
FIGS. 10, 11, 12 and 13 are enlarged plan views illustrating modified embodiments of some of components disposed in the area 'AA' of FIG. 5.

Referring to FIG. 10, a first opening portion OP1 and a second opening portion OP2 may be defined in a first non-overlapping electrode 312.

A shape of the first opening portion OP1 may be different from a shape of the second opening portion OP2. In FIG. 10, the first opening portion OP1 may have a rectangular shape, and a portion of the second opening portion OP2 may have a curved shape corresponding to a shape of the pressure applying area PA. However, embodiments of the inventive concept are not limited thereto.

Other components may be substantially the same as corresponding components described above, and thus the descriptions thereto are omitted.

Figure 11:
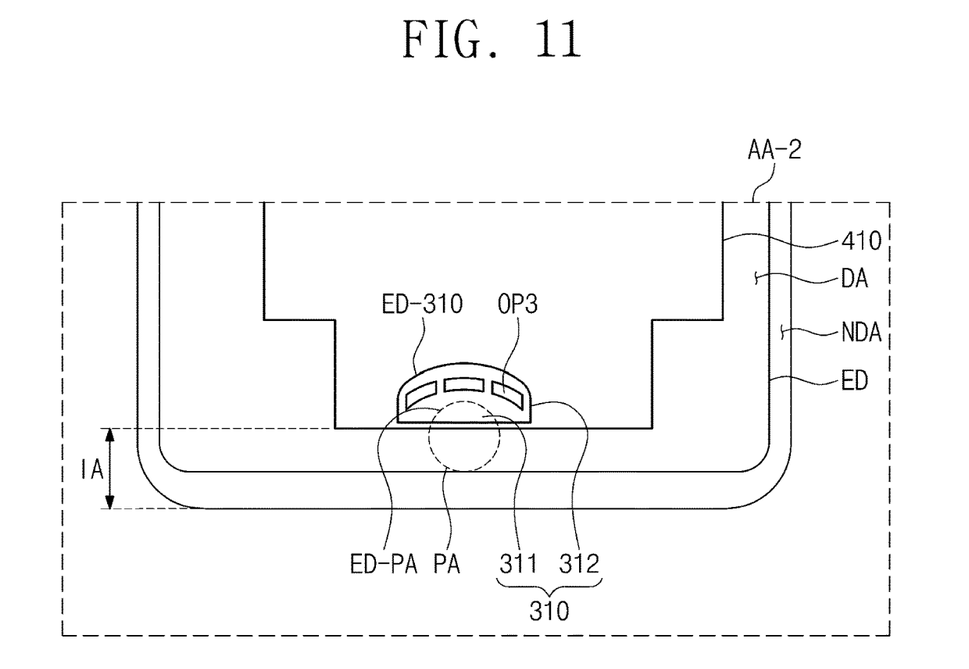

Referring to FIG. 11, a third opening portion OP3 may be defined in a first non-overlapping electrode 312. An edge ED-310 of the first non-overlapping electrode 312 may have a shape corresponding to a shape of an edge ED-PA of the pressure applying area PA. The third opening portion OP3 may have a shape corresponding to the shape of the edge ED-310 of the first non-overlapping electrode 312 or the shape of the edge ED-PA of the pressure applying area PA.

Other components may be substantially the same as corresponding components described above, and thus the descriptions thereto are omitted.

Figure 12:
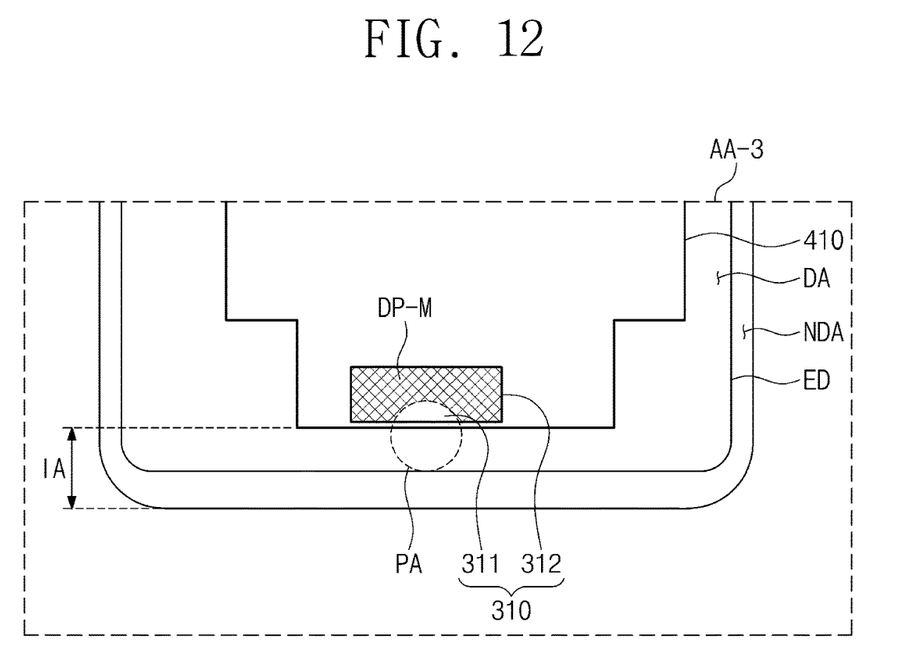

Referring to FIG. 12, a first non-overlapping electrode 312 may have a mesh shape. A plurality of opening portions OP-M may be defined in the first non-overlapping electrode 312 by the mesh shape.

Other components may be substantially the same as corresponding components described above, and thus the descriptions thereto are omitted.

Figure 13:
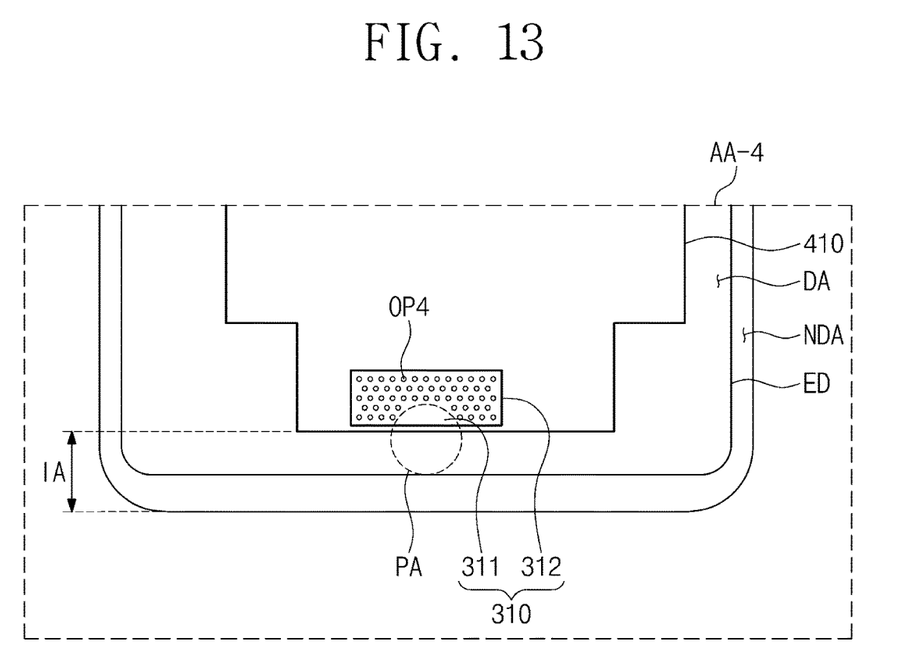

Referring to FIG. 13, a plurality of fourth opening portions OP4 may be defined in a first non-overlapping electrode 312. The fourth opening portions OP4 may be fine patterns of which widths are smaller than those of the opening portions OP, OP1, OP2 and OP3 described above.

Other components may be substantially the same as corresponding components described above, and thus the descriptions thereto are omitted.

Figure 14:
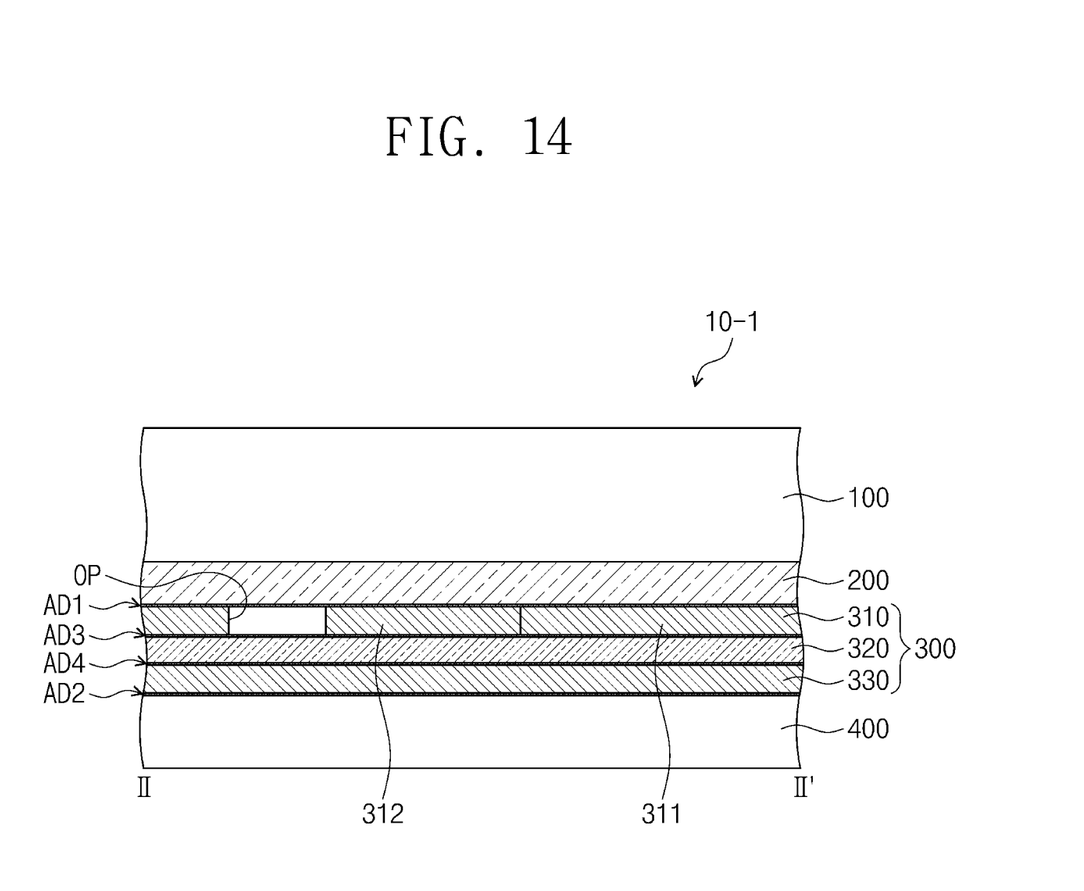
FIGS. 14, 15 and 16 are cross-sectional views taken along the line II-II' of FIG. 5 to illustrate display devices according to some embodiments of the inventive concept.
Figure 15:
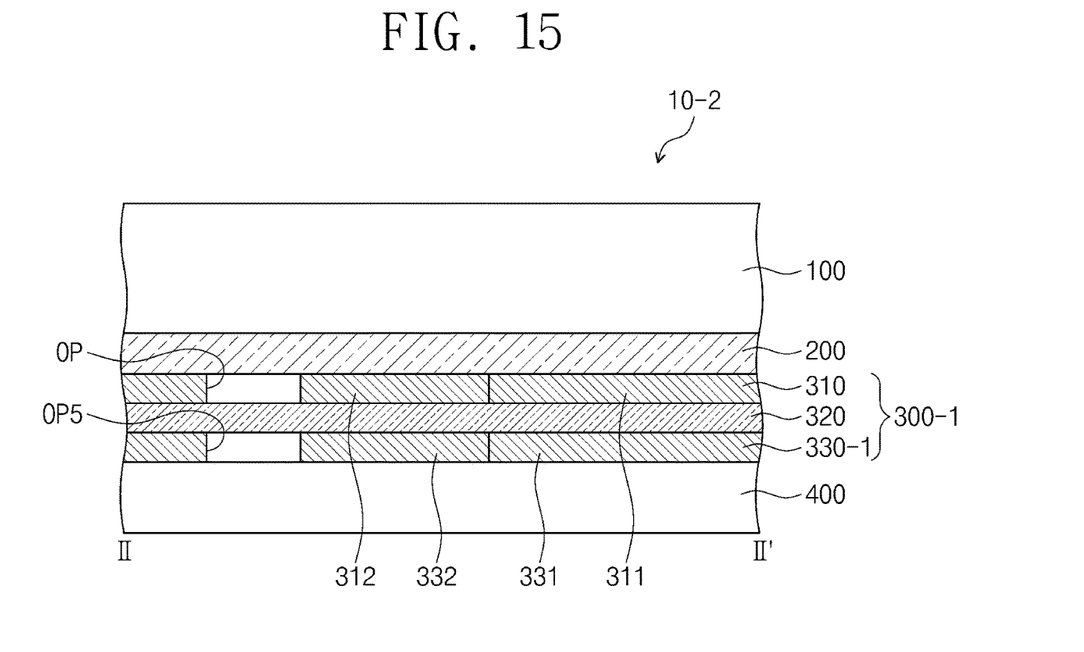
Figure 16:
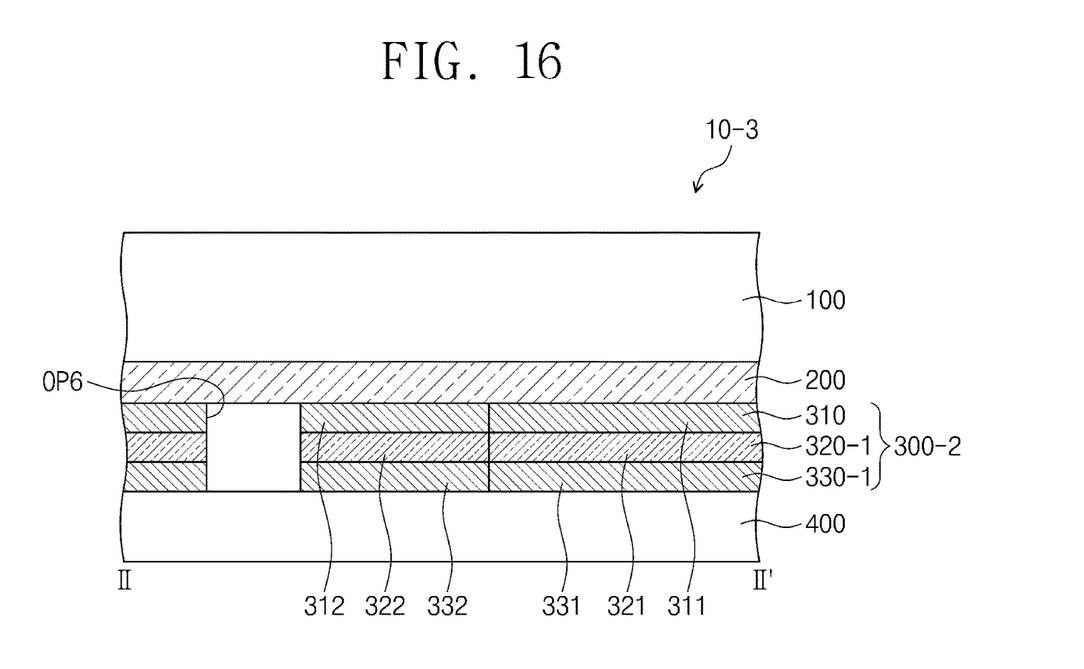

FIGS. 14, 15 and 16 are cross-sectional views taken along the line II-II' of FIG. 5 to illustrate display devices according to some embodiments of the inventive concept.

Referring to FIG. 14, adhesive members AD1, AD2, AD3 and AD4 may be disposed between layers of a display device 10-1.

A first adhesive member AD1 may be disposed between the display panel 200 and the first electrode 310 to adhere the display panel 200 to the pressure sensor 300.

A second adhesive member AD2 may be disposed between the driving unit 400 and the second electrode 330 to adhere the driving unit 400 to the pressure sensor 300.

A third adhesive member AD3 may be disposed between the first electrode 310 and the insulating member 320 to adhere the first electrode 310 to the insulating member 320.

A fourth adhesive member AD4 may be disposed between the second electrode 330 and the insulating member 320 to adhere the second electrode 330 to the insulating member 320.

In the present embodiment, the third and fourth adhesive members AD3 and AD4 may be components included in the pressure sensor 300.

However, embodiments of the inventive concept are not limited thereto. In another embodiment, one or some of the adhesive members AD1, AD2, AD3 and AD4 may be omitted. In an embodiment of the inventive concept, the insulating member 320 may have adhesive strength and thus may be adhered directly to the first electrode 310 and the second electrode 330.

Referring to FIG. 15, a display device 10-2 may include a pressure sensor 300-1.

The pressure sensor 300-1 may include the first electrode 310, the insulating member 320, and a second electrode 330-1.

The second electrode 330-1 may include a second overlapping electrode 331 overlapping with the first overlapping electrode 311 and a second non-overlapping electrode 332 overlapping with the first non-overlapping electrode 312. A fifth opening portion OP5 may be defined in the second non-overlapping electrode 332. The fifth opening portion OP5 of the second non-overlapping electrode 332 may overlap with the opening portion OP of the first non-overlapping electrode 312. However, embodiments of the inventive concept are not limited thereto. In another embodiment, the fifth opening portion OP5 of the second non-overlapping electrode 332 may not overlap with the opening portion OP of the first non-overlapping electrode 312.

In an embodiment of the inventive concept, when the fifth opening portion OP5 is defined in the second non-overlapping electrode 332, the opening portion OP may not be defined in the first non-overlapping electrode 312.

Other components may be substantially the same as corresponding components described above, and thus the descriptions thereto are omitted.

Referring to FIG. 16, a display device 10-3 may include a pressure sensor 300-2.

The pressure sensor 300-2 may include a first electrode 310, an insulating member 320-1, and a second electrode 330-1.

The insulating member 320-1 may include an overlapping insulating member 321 and a non-overlapping insulating member 322.

A sixth opening portion OP6 which penetrates the first electrode 310, the insulating member 320-1 and the second electrode 330-1 may be defined in the pressure sensor 300-2. An opening portion may be defined in the non-overlapping insulating member 322 by the sixth opening portion OP6.

Other components may be substantially the same as corresponding components described above, and thus the descriptions thereto are omitted.

Figure 17:
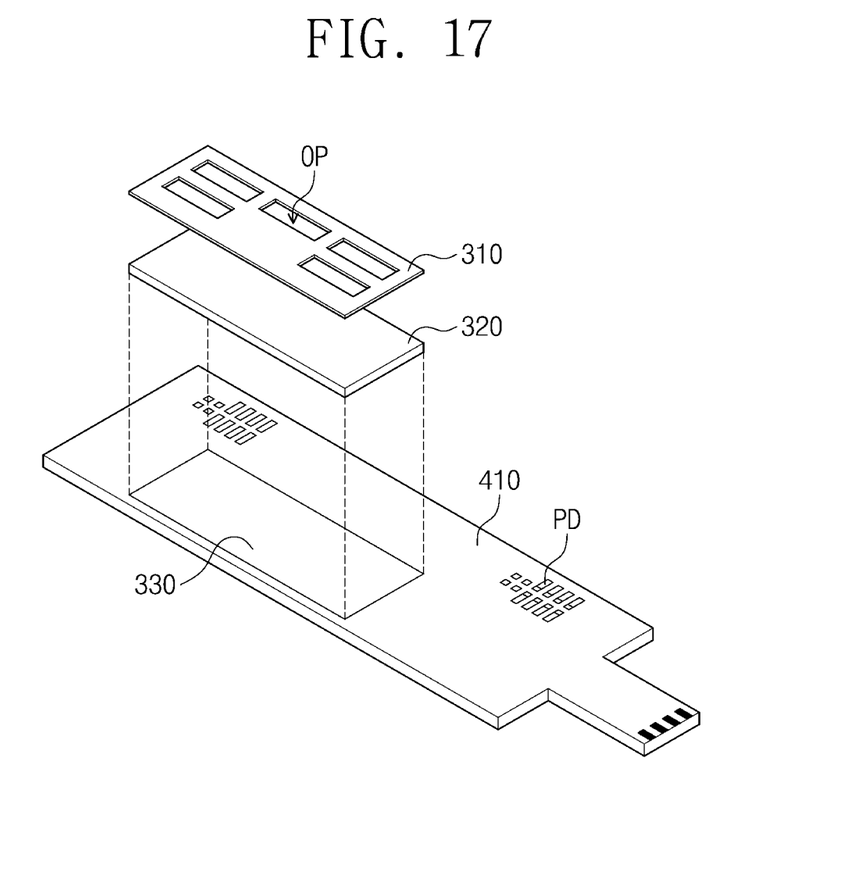
FIG. 17 is a perspective view illustrating a pressure sensor mounted on a printed circuit board in a display device according to an embodiment of the inventive concept.

FIG. 17 is a perspective view illustrating the pressure sensor 300 mounted on the printed circuit board 410 in a display device according to an embodiment of the inventive concept.

The printed circuit board 410 may include a plurality of pads PD. Electronic components may be mounted on the plurality of pads PD.

In an embodiment of the inventive concept, the second electrode 330 of the pressure sensor 300 may be formed together with the plurality of pads PD when the printed circuit board 410 is manufactured. In other words, the second electrode 330 may be one of the pads PD of the printed circuit board 410.

The insulating member 320 may be disposed on the second electrode 330, and the first electrode (or a sensing electrode) 310 may be disposed on the insulating member 320. Thus, the pressure sensor 300 may be formed. The second electrode 330 may have a shape corresponding to a shape of the first electrode 310.

According to an embodiment of the inventive concepts, the pressure sensor included in the display device may have the sensitivity which is substantially uniformly maintained, and thus the display device may accurately measure the pressure applied from the outside. As a result, it is possible to provide the display device which may actively use UI/UX using the pressure sensor.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A display device comprising:
   a display panel in which a display area to display an image is defined, wherein a pressure sensing image is displayed in the display area; and
   a pressure sensor disposed under the display panel and configured to sense a pressure applied to the pressure sensing image, wherein the pressure sensor comprises:
   a first electrode comprising a first overlapping electrode overlapping with the pressure sensing image and a first non-overlapping electrode not overlapping with the pressure sensing image, wherein at least one opening portion is defined in the first non-overlapping electrode;
   a second electrode overlapping with the first electrode; and
   an insulating member disposed between the first electrode and the second electrode and having elasticity.

2. The display device of claim 1, wherein the pressure sensing image is displayed adjacent to an edge of the display area.

3. The display device of claim 2, wherein the first non-overlapping electrode is closer to a center of the display area than the first overlapping electrode, in a plan view.

4. The display device of claim 3, wherein the first non-overlapping electrode extends from the first overlapping electrode.

5. The display device of claim 3, wherein a portion of a boundary of the first non-overlapping electrode has a shape corresponding to a shape of a portion of a boundary of the pressure sensing image.

6. The display device of claim 3, wherein the first non-overlapping electrode has a mesh shape.

7. The display device of claim 3, further comprising:
   an adhesive member disposed between the pressure sensor and the display panel.

8. The display device of claim 3, further comprising:
   a driving unit comprising: a pressure sensing circuit configured to sense a change in capacitance of the pressure sensor; and a printed circuit board on which the pressure sensing circuit is mounted.

9. The display device of claim 8, wherein the printed circuit board is disposed under the pressure sensor.

10. The display device of claim 3, wherein the second electrode is disposed under the first electrode.

11. The display device of claim 3, wherein the first electrode is disposed under the second electrode.

12. The display device of claim 3, wherein the second electrode comprises: a second overlapping electrode overlapping with the pressure sensing image; and a second non-overlapping electrode not overlapping with the pressure sensing image, and at least one opening portion is defined in the second non-overlapping electrode.

13. The display device of claim 3, wherein the insulating member comprises: an overlapping insulating member overlapping with the pressure sensing image; and a non-overlapping insulating member not overlapping with the pressure sensing image, and at least one opening portion is defined in the non-overlapping insulating member.

14. The display device of claim 3, wherein the pressure sensor further comprises:
   a first adhesive member disposed between the first electrode and the insulating member; and
   a second adhesive member disposed between the second electrode and the insulating member.

15. The display device of claim 3, wherein the insulating member has adhesive strength so as to adhere to the first electrode or the second electrode.

16. A display device comprising:
   a display panel in which a display area to display an image is defined, wherein the display area includes a pressure applying area configured to receive a pressure applied from an outside;
   a sensing electrode disposed under the display panel and comprising: an overlapping electrode overlapping with the pressure applying area; and a non-overlapping electrode not overlapping with the pressure applying area, wherein at least one opening portion is defined it the non-overlapping;
   an insulating member disposed under the sensing electrode and having elasticity; and
   a printed circuit board comprising a plurality of pads, wherein one of the plurality of pads is disposed under the insulating member.

17. The display device of claim 16, wherein the one of the plurality of pads has a shape corresponding to a shape of the sensing electrode.

18. The display device of claim 16, wherein a thickness of the insulating member changes depending on the pressure applied from the outside.

19. The display device of claim 16, further comprising:
   a pressure sensing circuit configured to sense a change in capacitance between the sensing electrode and the one of the plurality of pads,
   wherein the pressure sensing circuit is mounted on the printed circuit board.

20. The display device of claim 16, wherein the insulating member has adhesive strength so as to adhere to the sensing electrode or the one of the plurality of pads.

* * * * *